United States Patent [19]
Goslin et al.

[11] Patent Number: 6,120,549
[45] Date of Patent: Sep. 19, 2000

[54] METHOD AND APPARATUS FOR GENERATING OPTIMIZED FUNCTIONAL MACROS

[75] Inventors: Gregory R. Goslin, Los Gatos; Bart C. Thielges, San Jose; Steven H. Kelem, Los Altos Hills, all of Calif.

[73] Assignee: Xilinx, Inc., San Jose, Calif.

[21] Appl. No.: 08/777,272

[22] Filed: Jan. 6, 1997

[51] Int. Cl.[7] .................................................. G06F 17/50
[52] U.S. Cl. ........................................ 703/20; 395/500.02
[58] Field of Search ................................. 364/488, 489, 364/490, 491; 703/20; 395/500.02, 500.18

[56] References Cited

U.S. PATENT DOCUMENTS

| | | | |
|---|---|---|---|
| 5,500,800 | 3/1996 | Talbott | 364/468 |
| 5,594,657 | 1/1997 | Cantone et al. | 364/490 |
| 5,598,344 | 1/1997 | Dangelo et al. | 364/489 |

*Primary Examiner*—Kevin J. Teska
*Assistant Examiner*—Thai Phan
*Attorney, Agent, or Firm*—Adam H. Tachner; Jeanette S. Harms

[57] ABSTRACT

A method for designing an integrated circuit comprises the step of selecting a system-level parameterized module that performs a specified type of function. The method also includes the steps of specifying values for parameters of the selected system-level module and generating a netlist file from the selected system-level module. In one embodiment, the system-level parameterized module is selected from a family of system-level parameterized modules that each perform a particular function within different parameter ranges.

29 Claims, 6 Drawing Sheets

602 Filters
    603 Static
        FIR ⎫
        2-D DCT
        IIR
        Convolution
        Correlators ⎬ 604
        FFT
        iFFT
        Comb
        Integrator ⎭

600

603 Adaptive
        FIR ⎫
        IIR
        Convolution ⎬ 605
        Correlators
        Comb ⎭

608 Math
    610 Multipliers
        Constant ⎫
        Parallel ← [Family] → Parallel Option 1 A [8:20], B [8:12]
        Booths                       Parallel Option 2 A [8:12], B [8:20]  620
        Dadda ⎬ 612
        Booth-Pipelined
        Dadda Pipelined
        Sequential ⎭
            Bit-Serial MSB-first ⎫ 614
            Bit-Serial LSB-first ⎭
    610 Accumulators
        Scaled Parallel ⎫ 616
        Sequential     ⎭
    610 Adders/Subtractors
        Scald Parallel ⎫ 618
        Sequential    ⎭

Figure 4

|  | Parameter | Ranges | Adjusted Range |  |
|---|---|---|---|---|
| Module 1 | A | 12 | 12 x 1 = 12 |  |
|  | B | 4 | 4 x 4 = 16 |  |
|  |  | 16 | 28 | aggregate area (adjusted) |
|  |  | aggregate area |  |  |
| Module 2 | A | 4 | 4 x 1 = 4 |  |
|  | B | 12 | 12 x 4 = 48 |  |
|  |  | 16 | 49 | aggregate area (adjusted) |
|  |  | aggregate area |  |  |

Parameter Weight
A 1
B 4
~708

710

METHOD AND APPARATUS FOR GENERATING OPTIMIZED FUNCTIONAL MACROS

FIELD OF THE INVENTION

The present invention relates to the field of circuit design for semiconductor devices. More particularly, the present invention relates to the field of computer-aided engineering circuit design tools.

BACKGROUND OF THE INVENTION

Currently, circuit designers design integrated circuits to perform specific functions using one of several methodologies. An example of a design methodology is schematic capture. According to this methodology, a designer uses a computer to create a graphical description of the circuit with the desired functionality. For example, the circuit description could consist of a picture of the circuit at the transistor level. The description could also consist of a circuit diagram showing digital logic gates. Whatever the exact form of the graphical circuit description, software tools convert the graphical circuit description to another format representing the circuit layout for a semiconductor device. If the semiconductor device that is to implement the design circuit is a programmable device, the graphical circuit description is converted to a netlist and then to a serial bit stream which is downloaded to the programmable device.

In another design methodology, a circuit designer uses a hardware description language to write a text description of the circuit. Hardware description language files are behavioral descriptions of circuits and subcircuits including connection information. Hardware description language files can be converted to schematic form if desired, or converted directly to layouts or netlists. One example of a popular hardware description language is very large scale integration hardware description language (VHDL).

Regardless of what circuit design methodology is used, circuit designers must design for a specific integrated circuit architecture. Typically, circuit building blocks are provided by the vendor of the integrated circuit or by a third party. The building blocks are compatible with the methodology being used. For instance, they may be small schematic circuit or hardware description language files. Such building blocks usually include flip-flops, logic gates, and small common circuits made up of these low level elements. For example, small common circuits available as building blocks include various counters and adders. Libraries of such building blocks are provided so that circuit designers do not need to recreate common circuits each time they begin a design.

After a design performing a particular function has been completed for implementation on a particular integrated circuit architecture, extensive simulation and redesign is usually still required. This is because even though a particular design may be logically correct, it is not possible to predict its exact performance until it is actually implemented on the hardware. Considerations like physical area, resources available and timing behavior may make a circuit nonfunctional as initially designed. For this reason, the circuit designer typically uses software capable of simulating the performance of the circuit as designed on a particular integrated circuit architecture. Many errors in the function of the circuit will appear during simulation. As errors are identified, it is necessary to redesign the circuit, sometimes extensively, in order to eliminate them.

It would be desirable for a circuit designer to have available a library of system-level building blocks or components already designed to implement particular functions on a particular integrated circuit architecture and to meet specified performance requirements. As will be shown, the present invention allows a circuit designer to choose among hardware description language modules that perform particular high level system functions. The present invention allows the circuit designer to specify performance requirements for the functional module. A functional module is then generated that performs the specified function within the specified performance requirements and is targeted for a specified integrated circuit architecture. Thus, the present invention eliminates a great deal of design effort and also eliminates extensive circuit testing.

SUMMARY OF THE INVENTION

A method for designing an integrated circuit is described. The method comprises the step of selecting a system-level parameterized module that performs a specified type of function. The method also includes the steps of specifying values for parameters of the selected system-level module and generating a netlist file from the selected system-level module. In one embodiment, the system-level parameterized module is selected from a family of system-level parameterized modules that each perform a particular function within different parameter ranges.

BRIEF DESCRIPTION OF THE DRAWINGS

FIG. 4 is an illustration of a module taxonomy;

DETAILED DESCRIPTION

The present invention includes a library of parameterized system-level functional modules useful for a particular type of circuit design, for example a digital signal processing (DSP) circuit design. The present invention also includes a method for intelligently choosing a functional module that performs a user-specified system-level function within user-specified parameter values and is adapted to a specified target architecture. In the embodiments described, the library includes VHDL modules that represent circuits performing related high-level functions. For example, one library includes modules relating to DSP circuit design, such as various filters and multipliers and other modules. A group of modules such as filters is arranged in a hierarchy. The hierarchy includes filters of different types and filters of the same type that operate within different ranges for common parameters. Filters of the same type that operate within different ranges for common parameters comprise a family.

A user selects one of the modules from a family by selecting a module that will accommodate the user's specific parameter values. Alternatively, the user invokes a broker, which automatically selects a module that will accommodate the user's specific parameter values. More than one such module can exist in a family. According to one embodiment of the present invention, a broker selects the module of a family that will accommodate the user's specific parameter values and operate at the greatest speed. Other embodiments can select modules to achieve goals other than speed.

The present invention also includes a method for generating a netlist description of the functional module and a symbol description for the functional module. The netlist description and the symbol description are in standard format usable by common circuit design tools. The present invention eliminates extensive lower-level design and testing previously required for the development of system-level components.

Figure 1:
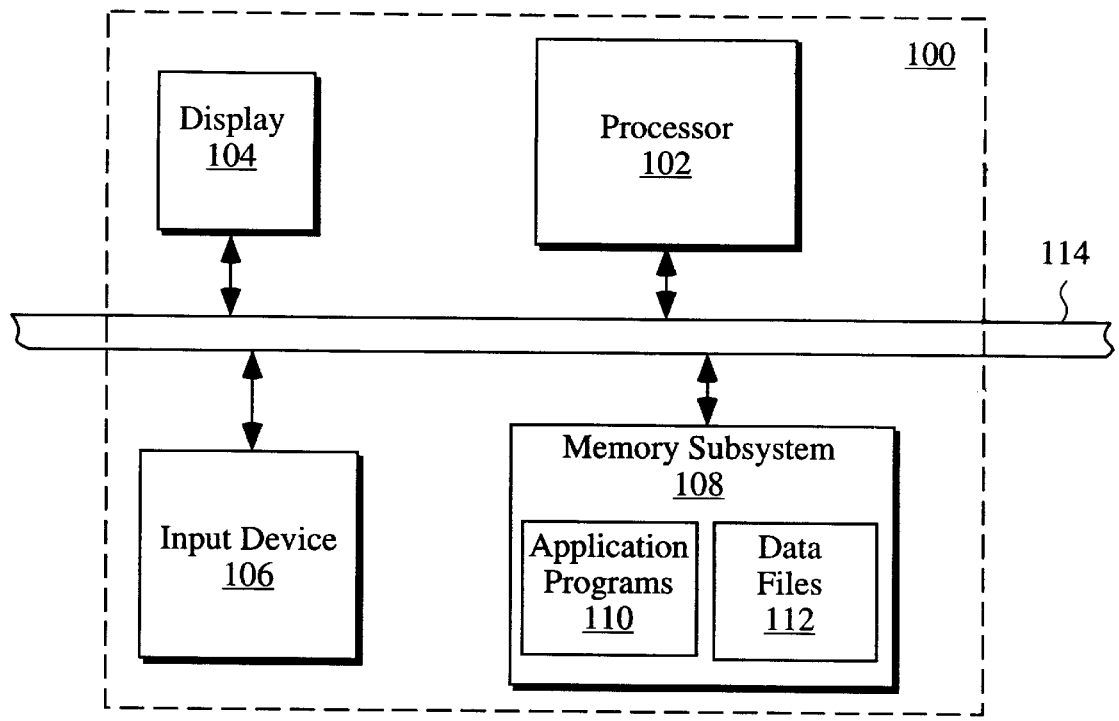
FIG. 1 is a block diagram of a computer system of one embodiment of the present invention.

FIG. 1 is a simplified block diagram of computer system 100 used with an embodiment of the present invention. Processor 102 receives data via system bus 114, from for example, input device 106. Input 106 device may be a keyboard or other input device. Processor 102 also receives data from devices on system bus 114 including other processors (not shown). Processor 102 also receives data from and transmits data to memory subsystem 108. Memory subsystem 108 includes various types of memory devices including random access memory (RAM), read only memory (ROM), and cache. Examples of information stored in memory subsystem 108 are application programs 110 and data files 112. When application programs are executed, processor 102 performs operations on data as directed by the application program. For example, processor 102 performs arithmetic operations and boolean logic operations. The application program may require processor 102 to output information to display device 104, or to other devices (not shown) on system bus 114. Computer system 100 is an example of a system architecture that can be used with the present invention. The present invention can be used with other types of computer system architectures.

For this embodiment, the present invention comprises an application program 110 that is stored in the memory subsystem of a computer system and executed by processor 102. For the embodiments of the present invention described herein, application program 110 of the present invention interacts with a user through a graphical user interface (GUI).

Figure 2:
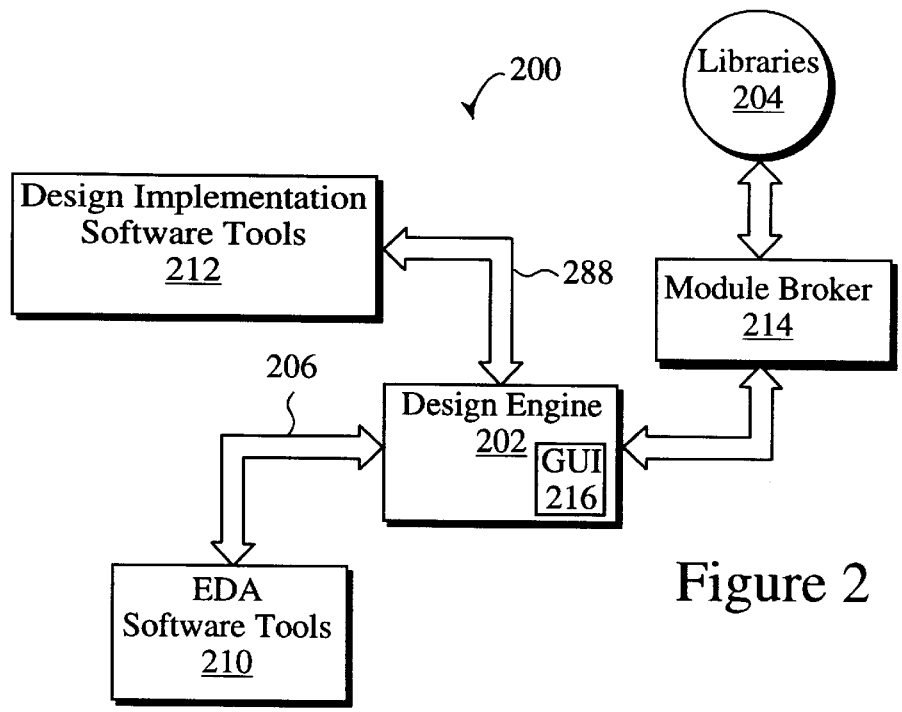
FIG. 2 is a high level block diagram of an embodiment of the present invention.

FIG. 2 is a very high-level block diagram of an embodiment 200 of the present invention. Design engine 202 allows the user to input information to direct the generation of system-level functional modules that meet user-specified performance requirements. Engineering design automation (EDA) interface 206 allows design engine 202 to receive data from and transmit data to existing EDA tools. EDA tools include software for algorithm development and design analysis. EDA tools help designers develop circuits for particular purposes. For example, an EDA tool may be used to develop a data compression algorithm for a particular application.

As a particular circuit design is developed using an EDA tool, design engine 202 receives information from the EDA software tools, for example constraints on particular operational parameters, for use in developing an implementation of the finalized circuit design for a target architecture.

Design implementation software interface 288 allows design engine 202 to exchange information with design implementation software tools 212. Design implementation software tools 212 include tools provided by suppliers of the target architecture to aid the designer in transferring a circuit design to one or more specific chips of the same or different architectures. An example of a design implementation software tool 212 is placement and routing software provided for use with field programmable gate arrays (FPGA) to match physical chip resources to specific elements of a "paper", or abstract, circuit design. Design implementation software tools 212 also include tools that allow creation of a schematic diagram of a circuit on a computer screen. Design implementation software tools 212 also include tools that perform logic synthesis. Logic synthesis involves creating an architecture-specific schematic and netlist from a hardware description language (HDL) file. A netlist is a description of a circuit design in the form of low-level logic elements like flip-flops and gates. The netlist also includes information describing all circuit connections between all of the elements in the design. An HDL file contains a description of the circuit in an HDL such as VHDL or Verilog.

Design-implementation software tools 212 also include tools that produce a netlist from an HDL circuit design. This process is known as elaboration. Examples of commercially available elaboration tools are Metamor and Synopsys Design Compiler. The embodiments of the present invention described herein include Metamor as an elaborator.

Design engine 202 includes GUI 216. As will be described in more detail below, GUI 216 allows the user to chose parameterized functional modules from a library of functional modules. GUI 216 accesses several libraries 204. Libraries 204 include parameterized system-level functional modules according to the present invention. In the embodiments described herein, a library of parameterized functional modules specifically for use in digital signal processing (DSP) circuit design will be referred to as an example. In the embodiments described herein, the library of parameterized functional modules is written in VHDL. Other libraries of libraries 204 could include specific parameterized system-level modules for circuit design focusing on applications other that DSP, for example computer arithmetic or pattern recognition. Libraries can also be written in other HDLs, and the implementation language can be different for each module in a library.

A parameterized functional module, as used herein, refers to a VHDL description of a system-level function. An example of a parameterized functional module according to one embodiment is a VHDL description of a DSP function, a filter. The VHDL description of the filter includes several parameters and a possible value range for each parameter. As an example, a finite impulse response (FIR) static filter according to one embodiment of the present invention includes the following parameters. There are two classes of parameters, "taps" and "data". Each class has several aspects that are parameterized.

FIR (Sum of Products) (default=Constant Coefficient):

A) Taps:
   1. Number of Taps
      Range: 2 to 128 Taps
   2. Symmetrical or Nonsymmetrical
B) Data:
   1. Input Data:
      (a) Number of Bits
         Range: 2 to 32 Bits -continued

| FIR (Sum of Products) (default=Constant Coefficient): |
| --- |
|    (b) Data Rate in MSPS (Million Samples per Second)<br>      Range: 0.001 MSPS TO 80 MSPS<br>   (c) Signed or Unsigned<br>2.  Coefficient Data:<br>   (a) Number of Bits<br>      Range: 2 to 64 Bits<br>   (b) Signed or Unsigned<br>   (c) Constant or Variable<br>3.  Output Data:<br>   (a) Number of Bits<br>      Range: 2 to 64 Bits |

Module brokers 214 may be invoked by a user through GUI 216. Module brokers 214 automatically choose a functional module, from libraries 204, that provides the functionality required by a user, is designed for the target architecture, and meets the user's specified performance requirements. Module brokers will be explained more fully below.

Figure 3:
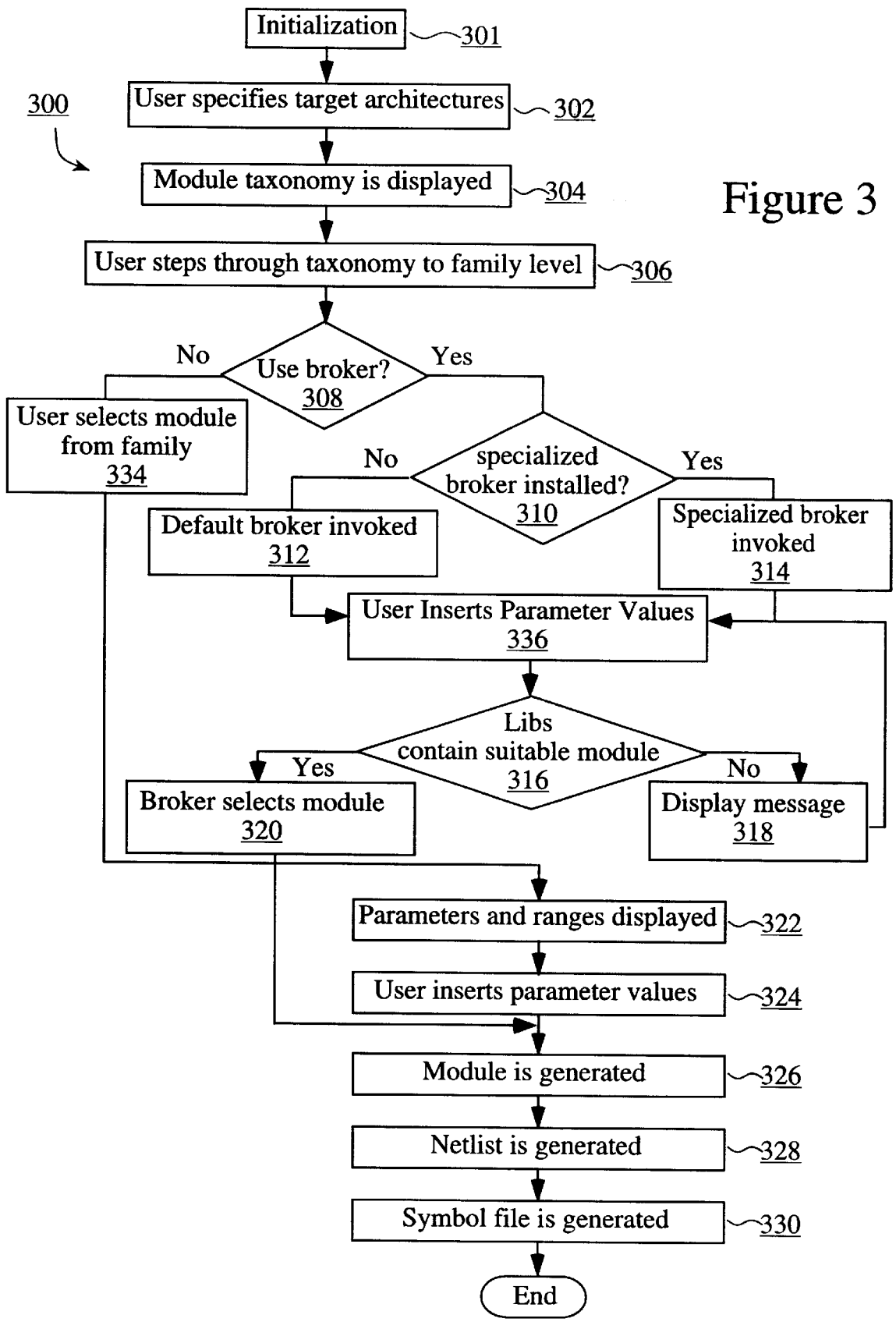
FIG. 3 is a flow diagram of one embodiment of the present invention.

FIG. 3 is an illustration of high-level flow diagram 300 of one embodiment of the present invention. It is assumed in flow diagram 300 that the user interacts with the present invention through GUI 216. At step 301, internal variables are initialized and initial values are read from files. At step 302 a user specifies a set of one or more target architectures. In this embodiment the target architecture is one of several FPGA architectures. In other embodiments, target architectures could include application specific integrated circuits (ASICs) or fully custom integrated circuits, or other architectures. At step 304 a module taxonomy is displayed on a computer screen. A module taxonomy is a hierarchy of available functional modules. The hierarchy is defined in terms of a classification hierarchy, similar to the classification of animals in terms of genus, species, etc. In this embodiment the taxonomy includes modules designed for development of digital signal processing (DSP) circuits.

FIG. 4 is an example of a module taxonomy according to this embodiment. Taxonomy 600 of FIG. 4 includes modules at several levels of hierarchy. At the highest level, taxonomy 600 includes filter modules 602 and math modules 608. Filter modules 602 include two second-level groups of modules 603 which include static filters and adapter filters. At a third level, static filters include filters 604, and adaptive filters include filters 605. For math modules 608 a second-level of hierarchy includes modules 610 that are multipliers, accumulators and adders/subtractors. Multipliers include modules 612, accumulators include modules 616, and adders/subtractors include modules 618. Two of modules 612 of multipliers 610 include an additional level of hierarchy. Specifically, sequential multipliers include two modules 614 and parallel multipliers include two optional parallel multipliers 620. At a lowest level of hierarchy a functional family is defined. For example, parallel multipliers 620 including parallel option 1 and parallel option 2 comprise a family. Similarly, sequential multipliers 614 bit-serial MSB-first and bit-serial LSB-first comprise a family. A taxonomy as displayed in step 304 (FIG. 3) does not necessarily display every level of hierarchy down to the family level. Rather, a user wishing to step through the hierarchy to lower-levels indicates through the GUI that they wish to do so.

According to this embodiment, a taxonomy of modules is determined by one of two methods. In the first method, the taxonomy is stored in a file. The taxonomy is read from the file during initialization step 301 of FIG. 3. In the second method, a process called taxonomy discovery is used to determine the taxonomy during execution of design implementation software tools 212 (FIG. 2). In the second method, a search path, consisting of a list of directory names corresponding to directories on a user file system (part of memory subsystem 108, in FIG. 1) contains a list of directories to be searched. Each directory in the search path contains at least one module generator. Each of these directories also contains a file that identifies the modules in that directory and associates one or more "taxonomy strings" with each module. A taxonomy string describes a module's place in a hierarchy of the taxonomy. Each level of hierarchy in the string is separated from adjacent levels by a separator. In the current embodiment, a slash character, "/", is used. The taxonomy string associated with a parallel multiplier 620 in FIG. 4, for example, would be "math/multipliers/parallel/option 1".

A module may have more than one taxonomy string associated with it. This is so that the module may be more easily found by users who expect to find the module in different places in the taxonomy. For example, by associating taxonomy string "parallel/multiplier/option 1" with the parallel multiplier 620, in addition to the taxonomy string "math/multipliers/parallel/option 1", the parallel multiplier may be found in two places in the hierarchy. This is useful because one user might think of "math" as a top-level category, while another might think of "parallel" as the top-level category.

This method accommodates not only the two categories described, but is extendable by the user to any other method of categorization If additional categories are desired, the user can add a taxonomy string to the list of strings associated with a module. During taxonomy discovery the new strings will be found and the module added to the taxonomy. The taxonomy discovery routine may be run at other times than initialization. In this case, taxonomy discovery would discover modifications and additions to, and deletions from the taxonomy. This saves a substantial amount of time because a user would not be required to terminate the design implementation software, make changes to the taxonomy and then restart.

When a family of modules is displayed, the user is queried regarding whether the user wishes to choose a module specifically from the family or whether the user wishes a broker to make the choice.

Referring again to FIG. 3, at step 308 the user opts to use a broker or not to use a broker. If the user opts not to use a broker, the user selects a specific module from the module family at step 334. Then, at step 322, parameters for the module chosen and value range for each parameter are displayed. At this step, the module broker may decide which architectures are optimal. In the example of FIG. 4, if the user chooses parallel multiplier option 1 from family 620, parameters for lengths of operand A and B would be displayed as shown in FIG. 4. Specifically, operand A can range from 8 to 20 bits and operand B can range from 8 to 12 bits. If the user chooses option 2, parameters and ranges for option 2 would be displayed. Specifically, operand A for option 2 ranges from 8 to 12 bits and operand B for option 2 ranges from 8 to 20 bits. If the user requires a parallel multiplier taking a first and a second operand both of 10 bits in length, either option 1 or option 2 would be suitable. At step 324 the user inserts the specific parameter values to be used with the chosen module. At step 326 the user directs through the GUI that the module should be generated. At step 328 a netlist is generated for the functional module. At step 330 a symbol file is generated for the functional module and the process is at an end.

Figure 5:
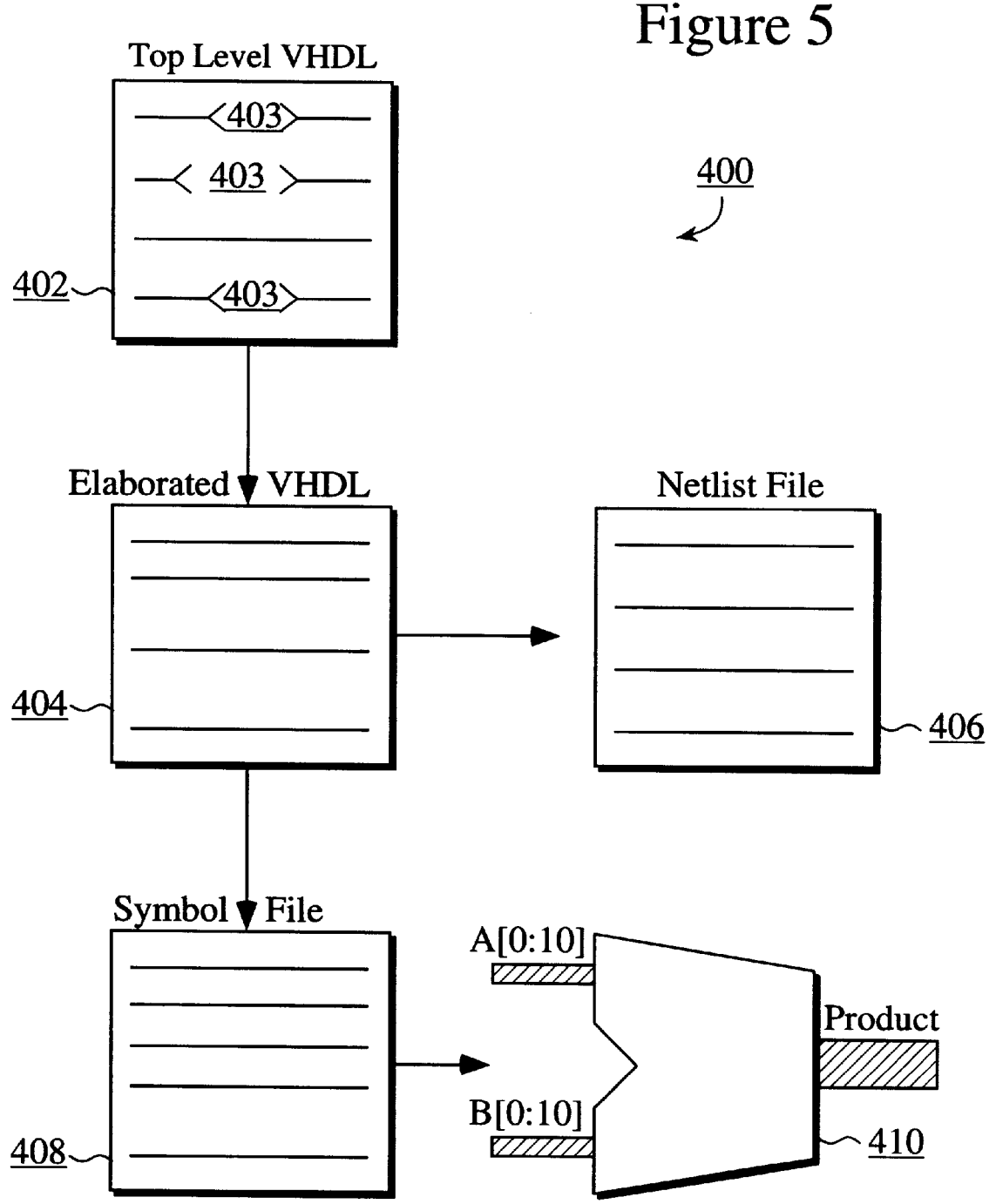
FIG. 5 is an illustration of symbol generation and netlist file generation.

FIG. 5 is a simplified illustration 400 of the process represented by steps 326, 328 and 330 of FIG. 3. Top-level VHDL module 402 is transformed into elaborated VHDL module 404. This step represents the process of module generation. Top-level VHDL module 402 shows gaps 403 where parameter values are to be inserted. Once specific parameter values are inserted into top-level VHDL module 402 it can be elaborated, or compiled. The preferred embodiment of the present invention uses a Metamor elaborator. In our example, top-level VHDL module 402 describes the behavior of a parallel multiplier. A parallel multiplier can include many smaller gate level functions. One aspect of the process of elaboration is reference to and incorporation of other smaller VHDL modules describing behavior of these smaller elements that go to make up the behavior of the selected parallel multiplier. From elaborated VHDL module 404 the elaborator generates netlist file 406. Netlist file 406 can be in any standard format. For this embodiment the format is electronic data interchange format (EDIF). The netlist file could be in another standard or nonstandard format. For example, the netlist file could be in Xilinx netlist format (XNF).

From elaborated VHDL module 404 symbol file 408 is also generated. Symbol file 408 is a computer-readable description of a graphical symbol in a standard format. Symbol file 408 is readable by schematic design tools to create a schematic diagram displayed on a computer screen. In other embodiments, symbol files such as symbol file 408 contain descriptions of symbols in VHDL.

From symbol file 408 graphical symbol 410 is generated. Symbol 410 is an example of a graphical symbol for a parallel multiplier. Symbol 410 could be a different shape or size or have a different number of inputs and outputs as required for different functional modules. Symbol 410 is a graphical representation of a high-level functional module generated according to the present invention without the need for the designer to go through the gate level design process. It should be noted that the parallel filter of the example is chosen for its simplicity. For example, two parameters, the bit widths of operands A and B, are available for this functional module. Other functional modules are much more complex than the exemplary multiplier. For example, the FIR filter described above allows a user to input many more parameters including data rate. According to prior methods, designing a module such as a FIR filter for a specific architecture and to specific performance requirements, including data rate, requires extensive design time and testing time.

Referring again to FIG. 3, module brokers and the concept of module brokering will now be explained. If the user opts at step 308 to have a broker select a module, at step 310 it is determined whether a specialized broker is installed. As will be explained in more detail below, a specialized broker takes priority over a default broker and will always be invoked if it is present. If a specialized broker is not installed, a default broker is invoked at step 312. At step 336 the user is queried for specific parameter values. At step 336 the user may input all or some of the specific parameter values applying to a possible functional module. At step 316, the default broker uses the specific parameter values indicated by the user to determine whether a module exists within the libraries that is suitable. For example, if the user specifies a parameter value for a particular parameter and there are no modules of the selected module family whose range of values for the particular parameter includes the parameter value specified, a message is displayed at step 318 indicating that no suitable modules could be found and the user may enter new parameter values. If suitable modules exist within the family the broker selects one of the modules at step 320. At this point, the process continues to steps 326, 328 and 330, where a module, a netlist and a symbol file are generated. As explained above, the symbol file is readable by a schematic capture tool for this embodiment, but for other embodiments is a VHDL symbol file.

The default broker selects a module from a family according to a particular heuristic. The default brokerage heuristic for this embodiment will be explained with reference to an example.

Figure 6:
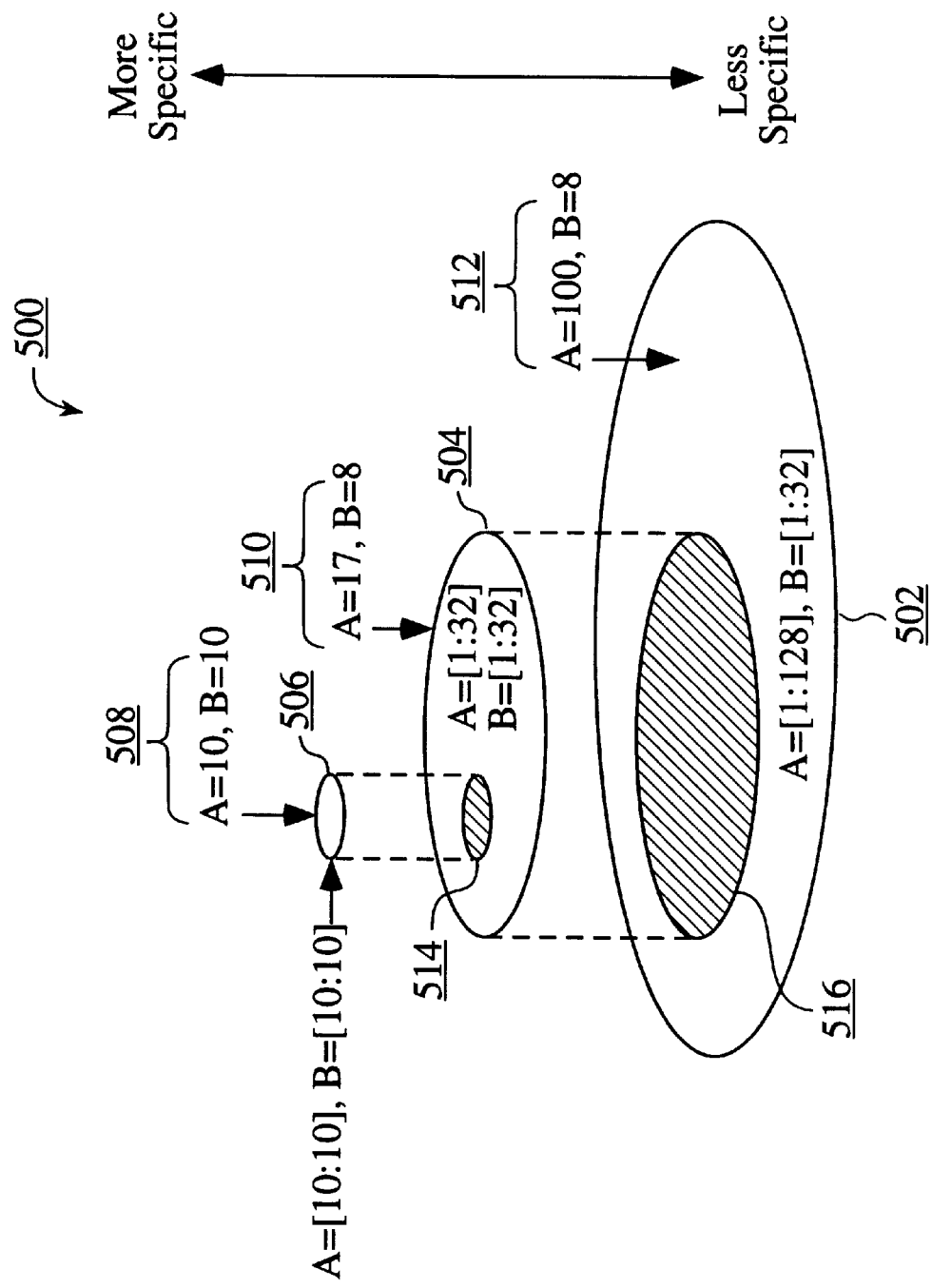
FIG. 6 is a symbolic representation of parameter value spaces.

Referring to FIG. 6, a symbolic representation of spaces 500 of possible parameter values for different modules is shown. Parameter value spaces 500 are parameter spaces for three distinct modules. Specifically, space 502 represents the space of possible parameter values for a module having a range for parameter A of 1 to 128 and a range for parameter B of 1 to 32. Parameter value space 504 is an area of possible values for a module having a range of values for parameter A of 1 to 32 and a range of values for parameter B of 1 to 32. Parameter value space 506 represents the area of all possible parameter values for a module having a value for parameter A of 10 and a value for parameter B of 10. Area 514 represents an area of overlap between parameter value spaces 506 and 504. Area 516 represents an area of overlap between parameter value spaces 502, 504, and 506. Assuming a functional module of some type with two parameters A and B, parameter values 512 represent one possible set of parameter values specified by a user for such a module. Set 512 includes values A=100 and B=8. As shown graphically in FIG. 6, value set 512 fits in only one of spaces 502, 504, and 506. Specifically, parameter value set 512 fits in only the largest space 502. Another possible set of parameter values 510 includes values A=17 and B=8. As shown, parameter value set 510 allows a module with either space 504 or 502 to be chosen. This is because parameter value set 510 falls into overlap area 516. According to the default broker of this embodiment the module chosen is the module with the smallest area of possible parameter values. Therefore, according to this embodiment the module with parameter value space 504 would be chosen when a user specifies parameter value set 510. Parameter value set 508 includes parameter values A=10 and B=10. Any of the three possible parameter spaces shown include parameter value set 508. Any of three modules with parameter value spaces 502, 504 or 506 could be chosen. The default broker of this embodiment chooses the module with the smallest possible parameter space. In this case parameter space 506 is the smallest and includes parameter values A=10 and B=10 only. This method of selection can be visualized as a specified parameter value set descending from the top of symbolic representation 500 and traveling downward. Parameter value spaces toward the top represent more specific cases and those toward the bottom represent less specific cases. According to this embodiment a parameter value set traveling downward would "select" the first parameter value space on which it falls.

The default broker of this embodiment chooses modules from a family as described with respect to FIG. 6 because the functional modules are designed in such a way that a wide parameter range is traded off for performance considerations. Therefore, it is a broad generalization according to this embodiment that a narrower parameter range equates with better performance, for instance, higher data rate capability. In this embodiment an assumption is made that a user desires the best performance available. Other embodiments could employ heuristics based upon different assumptions.

Figures 7A, 7B:
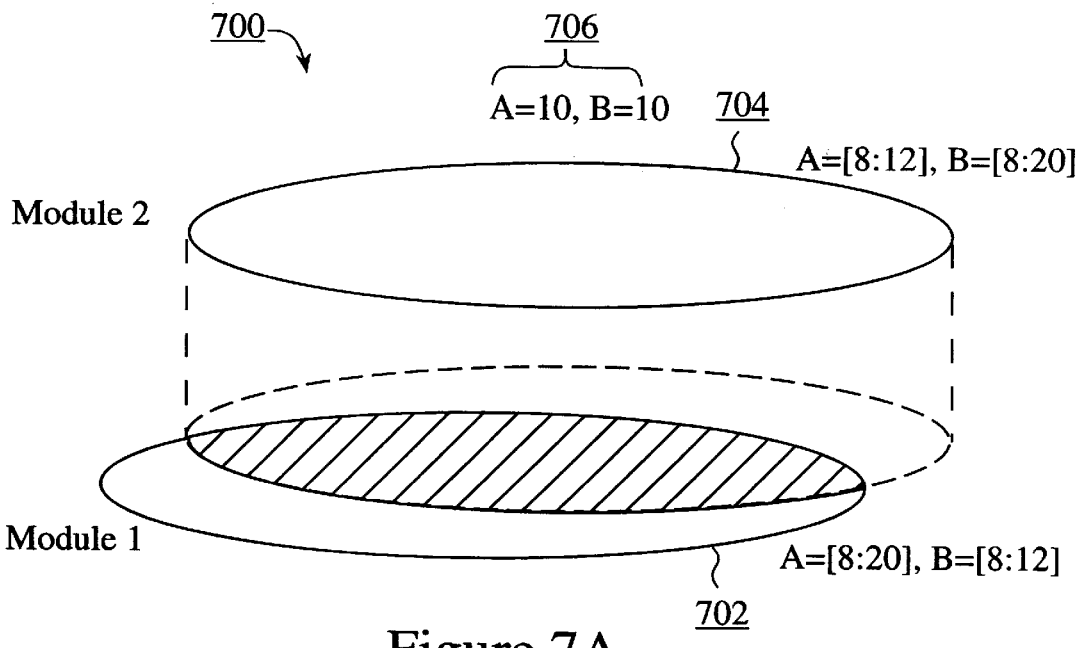
FIG. 7a is a symbolic representation of equivalent parameter value spaces of two modules.
FIG. 7b is an illustration of a heuristic used by the default broker of one embodiment.

FIGS. 7a and 7b illustrate how the default broker handles the situation in which two modules have identical possible parameter value spaces. FIG. 7a shows a symbolic representation 700 of such a situation. A parameter value space 702 of a first module, module 1, is shown. Module 1 includes parameters A and B where A ranges from 8 to 20 and B ranges from 8 to 12. Module 2 includes parameter value space 704 in which parameter A ranges from 8 to 12 and parameter B ranges from 8 to 20. As shown, the possible parameter value spaces for the two modules are the same size. However, the two modules do not completely overlap. For example, if a value of 18 were required for parameter A, module 2 would be suitable, but not module 1. In this example, a user specifies parameter value set 706 including A=10 and B=10. Either of modules 1 or 2 will satisfy parameter value set 706.

FIG. 7b illustrates how the default broker in this embodiment resolves the situation illustrated in FIG. 7a. The default broker refers to a parameter weight file 708. Parameter weight file 708 includes a weight for each parameter of each module. In this embodiment, weights are predetermined and assigned based upon assumptions regarding what performance characteristics have a higher importance for a module having a particular function. As will be described below, other embodiments allow a user to assign weights.

In this example, parameter A is given a weight of 1 and parameter B is given a weight of 4. Table 710 illustrates the calculation performed by the default broker in choosing between modules 1 and 2. Module 1 has a range for parameter A of 20-8 or 12, and a range for parameter B of 12-8 or 4. The sum of these two ranges represents an aggregate area of possible parameter values of 16. For module 2, the aggregate area of possible values is also 16 as shown in Table 710. This unadjusted aggregate area is illustrated in FIG. 7a as the areas of parameter value spaces 702 and 704. The range of module 1 can be adjusted using the weight from file 708. Specifically the range of parameter A is multiplied by the weight accorded parameter A and the range of parameter B is multiplied by the weight accorded parameter B. Adjusted ranges of 12 and 1 for A and B respectively are obtained. An adjusted aggregate area of 28 is obtained for module 1 by summing adjusted ranges of parameter values for A and B. By performing a similar operation with respect to module 2 an adjusted aggregated area of 49 is obtained. It can be seen that the adjusted aggregate areas of modules 1 and 2 differ by 21. The default broker would choose module 1 because it has the smaller adjusted aggregate area.

In the case of a further tie between weighted parameter ranges, the default broker would arbitrarily choose one of the modules.

The set of weights are originally stored in a parameter weight file 708. The user may choose to alter the weights so that some parameters influence the broker more than other parameters. For example, speed may be more important than area in some applications, so the user would assign a smaller weight for the speed parameter. To change the weights, the current set of weights is displayed, and the user is given the opportunity to change the weights to suit her design goals.

In another embodiment, a different weight selection scheme is employed. Rather than present the actual weights to the user, the user is presented with a normalized set of weights, all of which can be numbered arbitrarily. For example, all of the weights can be presented to be in the range of 0 to 11. The actual range of weights can be 0 to 100 for one weight, minus 50 to plus 42 for another weight, etc. A normalizing function for each weight maps the actual range of the weight to the normalized scale that is presented to the user. After the user adjusts the normalized weights, an inverse normalizing function for each weight maps the normalized weights back to the actual range of the weights. This method allows the use of any function that has an inverse function, so that linear functions and non-linear functions can be used. For example, a linear function may be used for one parameter, a quadratic function for a second parameter, an exponential function for a third parameter, and so on, depending upon the nature of each individual weight.

In another embodiment similar to the embodiment described above, a scale that has abstract markings, similar to a scale for a stereo hi-fi sound system equalizer, is presented to the user. This abstract scale takes the place of the normalized numeric scale of the previously described embodiment. The scale has designations such as "not important", "neutral", and "somewhat important". These designations are mapped to numeric values using functions like the ones described above.

Referring again to FIG. 3, if a specialized broker is determined to be installed in step 310 a specialized broker will be invoked at step 314. The specialized broker could employ any heuristic in selecting among modules. For one embodiment of the present invention brokers are written in an object-oriented programming language and specialized brokers are invoked over default brokers through the process of derivation or extension, as known in the computer programming field. According to this embodiment a class is defined for a broker. A default class broker is always available. The default broker can always be overridden however, by deriving a class from the default class. By this mechanism the behavior of the default broker can be overridden by the behavior of the specialized broker. According to the present invention it is possible for a user to write any broker desired and add the broker as a set of class files.

The present invention has been described with respect to an embodiment which generates functional modules for a designer of digital signal processing circuits. Other embodiments could include libraries of functional modules generated by the present invention that are applicable to areas other than digital signal processing. New or different libraries focused toward different circuit design disciplines can be added to the present invention. Such added libraries appear as available taxonomies through the GUI of the present invention without the need for extensive reconfiguration of the user's system.

The present invention also allows users to design and include their own high-level parameterized functional modules. Thus, a designer who has spent the time and effort to develop a high-level module and wishes to use and reuse it with different parameters and to take advantage of the brokering capabilities of the present invention can include the module in a library. In addition, library modules can be encrypted so that the intellectual property embodied therein is protected.

What is claimed is:

1. A method for designing an integrated circuit, comprising the steps of:

selecting a system-level parameterized module that performs a specified type of function on a particular integrated circuit architecture and to meet specified performance requirements;

specifying values for parameters of the selected system-level module; and generating a netlist file from the selected system-level module.

2. The method of claim 1, further comprising the step of selecting a family of system-level parameterized modules that each perform a particular function within different parameter ranges.

3. The method of claim 2, wherein the step of selecting comprises the step of invoking a broker that automatically selects a system-level module from the family that includes the specified parameters values.

4. The method of claim 3, wherein the broker selects a system-level module from the family that performs with the greatest speed within the specified parameter values.

5. The method of claim 1, wherein the step of specifying comprises selecting a certain value for each of a plurality of parameter ranges associated with the selected system-level module.

6. The method of claim 1, further comprising the step of generating a symbol file in an industry standard language for the selected system-level module.

7. The method of claim 6, further comprising the steps of:

using the symbol file to display a symbol representing the selected system-level module; and creating a schematic representation of a circuit including the selected system-level module.

8. The method of claim 1, wherein the selected system-level module is a hardware description language (HDL) module.

9. The method of claim 1, further comprising the step of using the netlist file to program one or more programmable devices.

10. The method of claim 1, further comprising the step of storing a plurality of related system-level modules as HDL files in a library on a computer memory device.

11. The method of claim 10, wherein the plurality of related system-level modules represent functions that are commonly used in digital signal processing.

12. A computer-implemented method for producing a circuit design for implementation on an integrated circuit device, comprising the steps of:

selecting a plurality of modules that perform a specified function from a plurality of computer-readable parameterized functional modules;

generating a module that satisfies a plurality of specified performance requirements from one of the modules that perform the specified function; and generating a netlist from the module that satisfies the plurality of specified performance requirements.

13. The computer-implemented method of claim 12, wherein each of the plurality of modules performs the specified function within a range of parameter values for each of the plurality of specified performance requirements, and wherein the step of generating a module that satisfies the plurality of specified performance requirements includes the step of choosing one of the modules that performs the specified function that operates at a specified parameter value within the range for each of the plurality of specified performance requirements, the chosen module having the smallest possible parameter ranges.

14. The computer-implemented method of claim 12, wherein each of the plurality of modules that perform the specified function operates within a range of parameter values for each of the plurality of specified performance requirements, and wherein the step of generating a module that satisfies the plurality of specified performance requirements comprises the steps of:

assigning a weighted performance rating to each of the modules that perform the specified function using specified weight factors for each of the plurality of specified performance requirements; and choosing one of the modules that perform the specified function based upon a comparison of their weighted performance ratings.

15. The computer-implemented method of claim 14, wherein the step of assigning a weighted performance rating includes the steps of:

for each of the modules that perform the specified function, determining a quantity for each of the plurality of specified performance requirements that is a result of a division of a difference between an upper limit of a range of parameter values associated with the performance requirement and a lower limit of the range by a weight factor associated with the performance requirement; and for each of the modules that perform the specified function, summing all quantities determined to produce a weighted performance rating.

16. The computer-implemented method of claim 15, wherein the step of generating a module that satisfies the plurality of specified performance requirements further comprises the step of assigning to the chosen module a parameter value within the range for each of the specified performance requirements.

17. The computer-implemented method of claim 12, further comprising the step of generating a computer-readable description of a graphical symbol for the module that satisfies the plurality of specified performance requirements.

18. The computer-implemented method of claim 12, wherein each of the computer-readable parameterized functional modules comprises a hardware description language (HDL) file stored on a memory device of the computer.

19. The computer-implemented method of claim 12, wherein the netlist description comprises an electronic data interchange format (EDIF) file stored on a memory device of the computer.

20. The computer-implemented method of claim 12, wherein the specified function relates to processing of digital signals.

21. The computer-implemented method of claim 20, wherein the plurality of specified performance requirements includes a minimum data rate.

22. The computer-implemented method of claim 12, wherein the step of selecting a plurality of modules includes the step of selecting system-level parameterized modules that perform a specified type of function on a particular integrated circuit architecture and meet specified performance requirements.

23. A computer-readable medium storing sequences of instructions which, when executed by a processor, cause the processor to perform the steps of:

querying a user for input;

responding to user input by selecting a target integrated circuit architecture to implement a circuit design and by displaying a hierarchical taxonomy of parameterized functional modules;

responding to user input by displaying progressively lower-levels of taxonomy hierarchy; and querying the user as to whether the user is to select a specific parameterized functional module or whether a module broker is to be invoked to select a specific parameterized functional module according to a heuristic.

24. The medium of claim 23, wherein the sequences of instructions further cause the processor to perform the steps of:

if the user selects a specific parameterized functional module, displaying a plurality of parameters for the module and a range of parameter values for each parameter;

receiving a parameter value within the range for each parameter; and responding to user input by generating a netlist and a schematic symbol file for the specific parameterized functional module selected.

25. The medium of claim 24, wherein the sequences of instructions further cause the processor to perform the steps of:

if the user indicates that the module broker is to be invoked, selecting a parameterized functional module according to the heuristic;

displaying a plurality of parameters for the module selected and a range of parameter values for each parameter;

receiving a parameter value within the range for each parameter; and responding to user input by generating a netlist and a schematic symbol file for the specific parameterized functional module selected.

26. The medium of claim 25, wherein the sequences of instructions further cause the processor to perform the steps of:

determining whether a specialized broker is installed on the medium;

if a specialized broker is not installed, designating a default broker as the broker; and if a specialized broker is installed, designating the specialized broker as the broker.

27. The medium of claim 26, wherein the sequences of instructions further cause the processor to perform the step of, if the default broker is designated as the broker, selecting a parameterized functional module by comparing weighted performance ratings of a plurality of modules of a family having a same function.

28. The medium of claim 27, wherein the sequences of instructions further cause the processor to perform the steps of determining a weighted performance rating for a module by subtracting a lower limit of the range from an upper limit of the range and multiplying the result by a predetermined weight factor of the parameter.

29. The medium of claim 28, wherein the sequences of instructions further cause the processor to perform the step of selecting a parameterized functional module with a lowest weighted performance rating, the lowest weighted performance rating representing a smallest area within a space defined by ranges of the plurality of parameters associated with the module.

* * * * *